(12) United States Patent
Grudowski et al.

(10) Patent No.: US 6,864,135 B2
(45) Date of Patent: Mar. 8, 2005

(54) SEMICONDUCTOR FABRICATION PROCESS USING TRANSISTOR SPACERS OF DIFFERING WIDTHS

(75) Inventors: Paul A. Grudowski, Austin, TX (US); Jian Chen, Austin, TX (US); Choh-Fei Yeap, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/285,374

(22) Filed: Oct. 31, 2002

(65) Prior Publication Data

US 2004/0087090 A1 May 6, 2004

(51) Int. Cl.$^7$ .......................................... H01L 21/8238
(52) U.S. Cl. ...................................... 438/230; 438/275
(58) Field of Search ................................. 438/230, 275, 438/286, 585

(56) References Cited

U.S. PATENT DOCUMENTS

| | | | | |
|---|---|---|---|---|
| 5,021,354 A | * | 6/1991 | Pfiester | 438/230 |
| 5,291,052 A | * | 3/1994 | Kim et al. | 257/369 |
| 5,696,012 A | * | 12/1997 | Son | 438/231 |
| 6,506,642 B1 | * | 1/2003 | Luning et al. | 438/231 |
| 2002/0068405 A1 | * | 6/2002 | Ono | 438/275 |
| 2002/0098633 A1 | * | 7/2002 | Budge et al. | 438/184 |

FOREIGN PATENT DOCUMENTS

GB         2257563 A  *  1/1993  ............. B24B/9/10

\* cited by examiner

*Primary Examiner*—George Fourson
*Assistant Examiner*—Fernando L. Toledo
(74) *Attorney, Agent, or Firm*—Joseph P. Lally

(57) ABSTRACT

A semiconductor fabrication process is disclosed wherein a first gate (108, 114) is formed over a first portion of a semiconductor substrate (102) and a second gate (114, 108) is formed over a second portion of the substrate (102). A spacer film (118) is deposited over substrate (102) and first and second gates (108, 114). First spacers (126) are then formed on sidewalls of the second gate (114) and second spacers (136) are formed on sidewalls of first gate (108). The first and second spacers (126, 136) have different widths. The process may further include forming first source/drain regions (128) in the substrate laterally disposed on either side of the first spacers (126) and second source/drain regions (138) are formed on either side of second spacers (136). The different spacer widths may be achieved using masked first and second spacer etch processes (125, 135) having different degrees of isotropy. The spacer etch mask and the source/drain implant mask may be common such that p-channel transistors have a different spacer width than n-channel transistors.

19 Claims, 3 Drawing Sheets

SEMICONDUCTOR FABRICATION PROCESS USING TRANSISTOR SPACERS OF DIFFERING WIDTHS

BACKGROUND OF THE INVENTION

1. Field of the Invention

The present invention relates generally to the field of semiconductor fabrication and, more particularly, to the field of fabricating p-channel and n-channel transistors with different characteristics on a common substrate.

2. Description of Related Art

In complementary metal oxide semiconductor (CMOS) fabrication, p-channel and n-channel transistors are fabricated on the same semiconductor substrate. To achieve transistors of both polarities (conductivity types), it is necessary that at least some process is steps differentiate between p-type and n-type transistors. Separate implant steps, for example, are needed to define n-well and p-well structures and to dope the source/drain regions of n-channel and p-channel transistors. Whenever possible, however, it is generally desirable to use a single process step to define transistor features regardless of the transistor type. Single process steps imply a single mask step, which is always desirable to reduce load on the photolithography processing. Moreover, a single step generally minimizes undesirable variations between the p-channel and n-channel transistors. Imagine, for example, that a particular design has been optimized under the assumption that the thickness of the gate oxide (or other dielectric) is the same on n-channel and p-channel transistors. The best way to ensure that the assumption is correct is to form the relevant feature for p-channel and n-channel transistors simultaneously.

In some cases, however, it may be desirable to process n-channel and p-channel transistors separately to account for differences in the characteristics of the respective transistor types. As an example, there is an asymmetry in the sub-micron behavior of p-channel and n-channel transistors. For sub-micron p-channel transistors, the high diffusivity of its boron carriers causes sub-threshold leakage current to be of paramount concern. For n-channel transistors, the drive current or saturated drain current (IDS), which is an important performance parameter, is strongly influenced by the effective length of the source/drain extension region due to the parasitic resistance that it creates. Whereas it would be desirable to have shorter extensions to increase the n-channel drive current, it would be desirable to have longer extensions to reduce the p-channel sub-threshold leakage current. It would therefore be desirable to implement a process that simultaneously addressed these concerns without substantially increasing the cost or complexity of the process.

SUMMARY OF THE INVENTION

The problem identified above is addressed by a semiconductor fabrication process as disclosed herein in which a first gate is formed over a first portion of a semiconductor substrate and a second gate is formed over a second portion of the substrate. A spacer film is deposited over substrate and first and second gates. First spacers are then formed on sidewalls of the second gate and second spacers are formed on sidewalls of first gate. The first and second spacers have different widths. The process may further include forming first source/drain regions in the substrate laterally disposed on either side of the first spacers and second source/drain regions are formed on either side of second spacers. The different spacer widths may be achieved using masked first and second spacer etch processes having different degrees of isotropy. The spacer etch mask and the source/drain implant mask may be common such that p-channel transistors have a different spacer width than n-channel transistors.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

Figure 1:
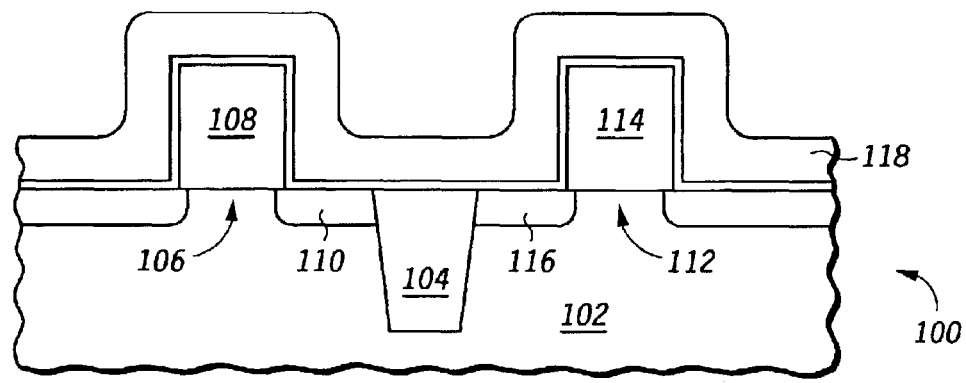
FIG. 1 is a partial cross sectional view of a semiconductor wafer or substrate on which a first and second transistor gates have been formed and a spacer film has been deposited.

Reference will now be made in detail to the presently preferred embodiments of the invention, examples of which are illustrated in the accompanying drawings. It should be noted that the drawings are in simplified form and are not to precise scale. Although the invention herein refers to certain illustrated embodiments, it is to be understood that these embodiments are presented by way of example and not by way of limitation. The intent of the following detailed description is to cover all modifications, alternatives, and equivalents as may fall within the spirit and scope of the invention as defined by the appended claims.

It is to be understood and appreciated that the process steps and structures described herein do not cover a complete process flow for the manufacture of an integrated circuit. The present invention may be practiced in conjunction with various integrated circuit fabrication techniques that are conventionally used in the art, and only so much of the commonly practiced process steps are included herein as are necessary to provide an understanding of the present invention.

Generally speaking, the present invention is directed towards a fabrication method in which spacer structures of differing dimensions are selectively formed on respective portions or regions of a wafer. The preferred implementation achieves differentially sized spacers from a single spacer film that is deposited over the transistor gates. In one embodiment, the process requires the addition of only a single etch step. In processes that include a suicide block mask, the present invention may even enable the reduction of a masking step. The differentially sized spacers may be selected to correspond to the conductivity type of the transistors such that transistors of a first conductivity type have first spacers while transistors of a second conductivity type have second spacers. In one implementation suitable for sub-micron technologies, a relatively narrow spacer is formed on n-channel transistors to improve the n-channel saturated drain current while relatively wide spacers are formed on p-channel transistors to improve sub-threshold leakage current margins.

Turning now to the drawings, FIGS. 1 through 7 illustrate partial cross-sectional views of a semiconductor wafer 100 at selected stages in a fabrication process according to one embodiment of the present invention. Wafer 100 is preferably a substantially circular slice of a semiconductor material as is well known in the semiconductor fabrication field. Wafer 100 likely includes a substrate 102 that is monocrystalline silicon, but may include other semiconductor elements or compounds including, for example, germanium, silicon-germanium, gallium-arsenide, and the like. Substrate 102 may be doped with a p-type or n-type impurity such as boron, arsenic, phosphorous, or antimony. The depicted portion of substrate 102 may have an epitaxial layer, which is relatively lightly doped, formed on a bulk substrate (not depicted), which is relatively heavily doped. In a silicon-on-insulator (SOI) implementation, the depicted portion of substrate 102 is disposed on an oxide or other dielectric layer (not depicted) that is intermediate between the depicted portion of substrate 102 and an underlying bulk substrate.

As depicted in FIG. 1, an isolation region 104 has been formed in substrate 102. Isolation region 104 is preferably a dielectric material such as silicon oxide. Isolation region 104 may be fabricated using well-known trench isolation or local oxidation LOCOS) techniques. Isolation region 104 provides electrical and physical isolation between the conductive components of adjacent transistor structures.

At the stage of the process shown in FIG. 1, a portion of the processing necessary to form a first transistor 106 and a second transistor 112 disposed on either side of isolation region 104 has been performed. This processing likely includes the formation of a gate dielectric film on an upper surface of substrate 102 followed by the deposition and patterning of a gate electrode film to form first and second gates 108 and 114 respectively. Thereafter, doped extension regions 110 and 116 are introduced into regions of substrate 102 adjacent gates 108 and 114 respectively. The gate dielectric film may include thermally formed silicon oxide although other dielectric materials including "high-K" dielectric materials having a dielectric constant greater than that of silicon oxide may also be used. Gates 108 and 114 are likely to include doped polysilicon although the gates may also include metals, metal nitrides, and metal suicides or a combination thereof. The extension regions 110 and 116 are preferably relatively shallow and lightly doped regions introduced into substrate 102 by ion implantation using gates 108 and 114 as an implant mask in a manner that will be familiar to those in the field of semiconductor fabrication. First extension regions 110 may contain a first conductivity type (e.g., n-type) dopant while second extension regions 116 may contain a second (e.g., p-type) conductivity type dopant that is different than the first conductivity type.

A spacer film 118 is shown as formed over wafer 100. Spacer film 118 is preferably a substantially conformal dielectric film such as, for example, low pressure chemical vapor deposited (LPCVD) or plasma enhanced chemically vapor deposited (PECVD) silicon nitride. In alternative embodiments, spacer film 118 may consist of or include an alternative dielectric such as silicon-oxide, tantalum pentoxide, barium strontium titanate, or lead zirconium titanium. In one embodiment, a thickness of spacer film 118 is in the range of approximately 200 to 1200 angstroms with a preferable thickness of approximately 600 angstroms. The present invention preferably achieves the formation of selective sized spacer structures formed from a single or common spacer film. This approach beneficially simplifies the processing required to form the spacer films for each spacer type. Thus, spacer film 118 may be blanket deposited over wafer 100 in a single deposition step.

Figure 2:
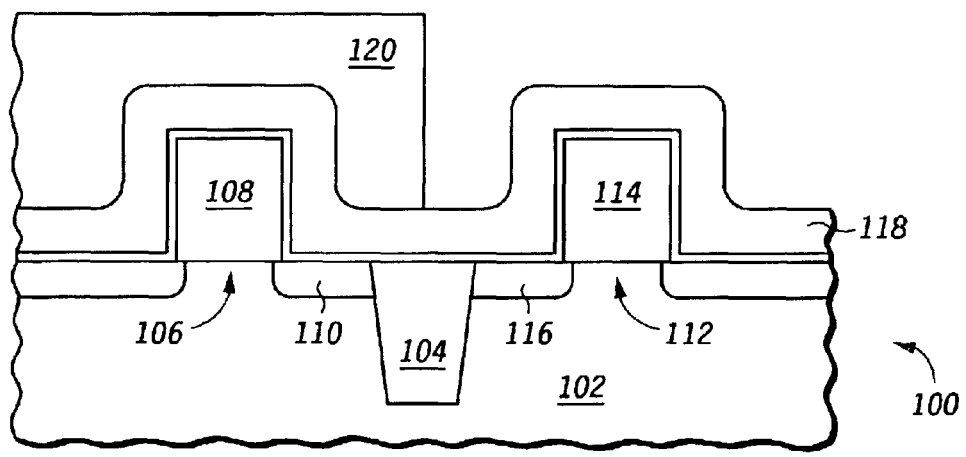
FIG. 2 illustrates processing subsequent to FIG. 1 in which a first spacer etch ask has formed over selected portions of the wafer.

Turning now to FIG. 2, a first spacer etch mask 120 is formed on wafer 100 to exposed selected portions of spacer film 118. Spacer etch mask 120 may be a photoresist mask achieved with conventional photolithography processing steps. In one embodiment, first spacer etch mask 120 exposes portions of spacer film 118 over transistors, such as transistor 112, that are of a second conductivity type (e.g., p-channel), while masking portions of spacer film 118 over transistors, such as transistor 106, that are of a first conductivity type (e.g., n-channel transistors).

Figure 3:
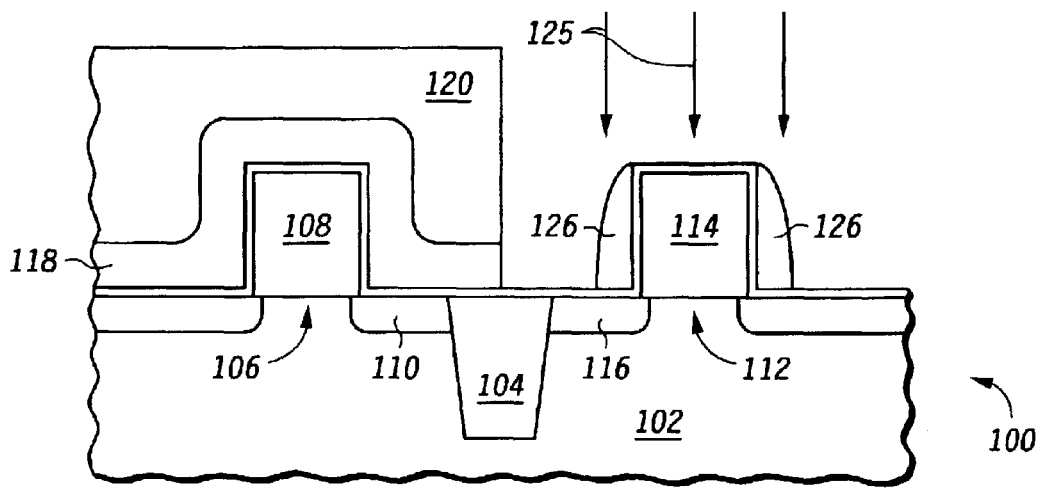
FIG. 3 illustrates processing subsequent to FIG. 2 in which a first spacer etch is performed on the unmasked portions of the wafer.

In FIG. 3, a first spacer etch process indicated by reference numeral 125 is performed to form first spacers 126 on sidewalls of gates 114 of transistors 112 that were not masked by first spacer etch mask 120. First spacer etch process 125 may include an etch process having a relatively high degree of anisotropy that produces significant etch directionality such that a lateral dimension of spacers 126 is relatively large. In one embodiment, first spacer etch process 125 may include a magnetically enhanced plasma etch in which an etching ambient, that may contain oxygen ($O_2$) and a fluorine bearing compound such as $CF_4$, is activated or energized by a radio frequency electric field. One embodiment of the plasma enhanced spacer etch process produces a post-etch spacer width to as a posited spacer film thickness ratio, also referred to herein as the process's anisotropy; of approximately 0.9, which will be recognized by those in the field as characteristic of a relatively anisotropic etch process that produces a relatively wide spacer. For an embodiment in which film 118 is PECVD silicon nitride having a thickness of 600 angstroms, spacers 126 may have a thickness of roughly 540 angstroms. In an example etch process suitable for use as first spacer etch process 125, the etch is performed under relatively high RF energy (200 W or more), with a magnetic field of approximately 10 Gauss, a pressure of approximately 80 millitorr, a CF4 flow rate of 50 sccm, and an HBr flow rate of 15 sccm.

Figure 4:
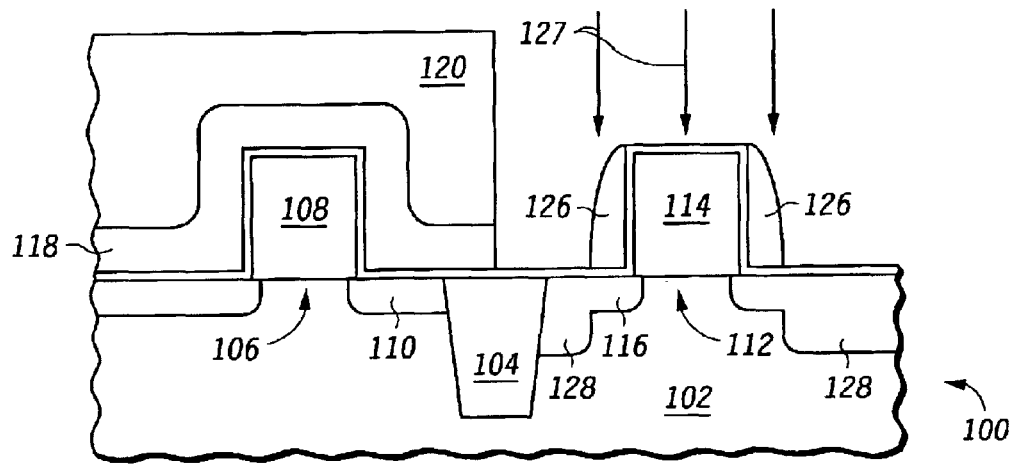
FIG. 4 illustrates processing subsequent to FIG. 3 in which a first source/drain implant is introduced into unmasked portions of the wafer.

Turning now to FIG. 4, first source/drain regions 128 are formed, while mask 120 is still in place, in the un-masked portions of substrate 102 laterally disposed on either side of spacers 126. First source/drain regions 128 are preferably formed with an ion implantation process indicated by reference numeral 127 using spacers 126 and gate structure 114 as a mask in the portions of wafer 100 not covered by first spacer etch mask 120. In this embodiment, the source/drain regions 128 are formed in the same portions of wafer 100 as spacers 126. In other words, the invention beneficially employs a single masking step to define the portions of wafer 100 that receive two processing steps, namely, first spacer etch process 125 and first source/drain implant process 127. In one embodiment suitable for use in CMOS processes, first spacer etch mask 120 may mask those portions of wafer 100 that contain transistors of a first conductivity type and expose those portions of wafer 100 containing transistors of a second conductivity type. Thus, spacer etch mask 120 may expose portion of substrate 102 in which p-channel transistors are to be formed while masking those portion of substrate 102 in which n-channel transistors are to be formed. It will be appreciated that, because this embodiment of mask 120 is coincident with the respective source/drain implant mask, the present invention may use a single mask to define a spacer etch process as well as a transistor implant step. Because the transistor implant step already requires a mask, the selective spacer etch is accomplished without adding a mask step.

Figure 5:
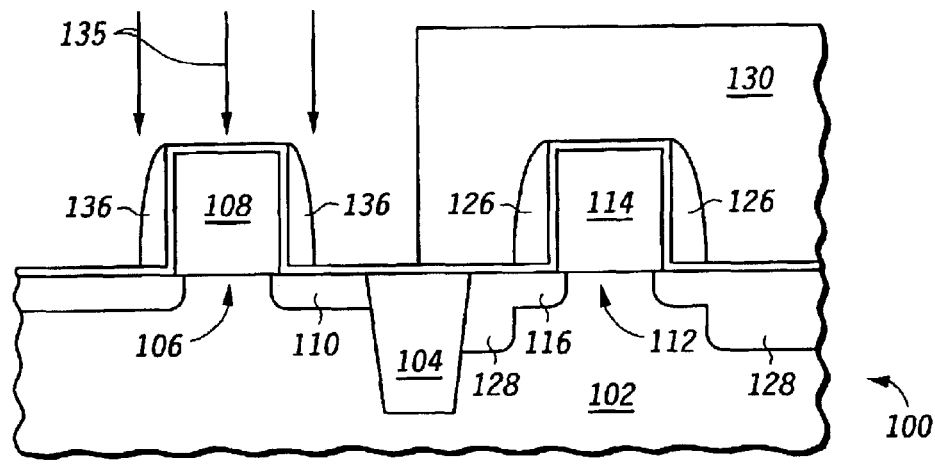
FIG. 5 illustrates processing subsequent to FIG. 4 in which a second spacer etch mask is formed of selected portions of the wafer and a second spacer etch is performed.

Turning now to FIG. 5, first spacer etch mask 120 has been removed and a second spacer etch mask 130 has been patterned on wafer 100 to expose selected portions of wafer 100. First and second spacer etch masks 120 and 130 may be substantially mirror images of one another such that those portions of wafer 100 exposed by first spacer etch mask 120 are exposed by second spacer etch mask 130.

Figure 8:
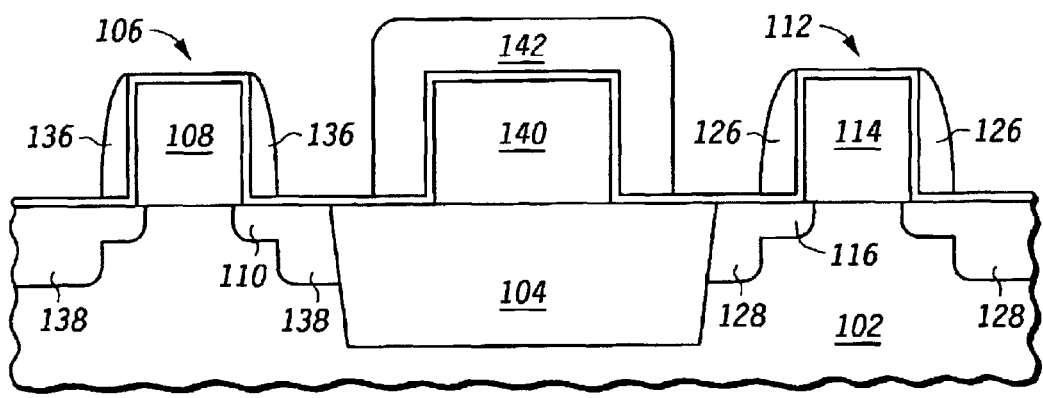
FIG. 8 illustrates an embodiment of the invention in which portions of the spacer film remain intact over portions of a polysilicon film.

In another embodiment, there may be some regions of wafer 100 that are either masked by both the first and second spacer etch masks or exposed by both. Referring to FIG. 8, it may be desirable in a process that employs silicided polysilicon, for example, to leave portions 140 of the spacer film intact over portions 142 of the polysilicon film, which is the film from which gate structures 108 and 114 are formed. The motivation for leaving portions 140 of the spacer film over portions 142 of the polysilicon film might include the desire to fabricate a highly resistive polysilicon structure for use as a high impedance resistor (not depicted). To achieve such a structure, it is generally advisable to mask some portion of the polysilicon film from a subsequent silicidation process because the silicidation process is specifically designed to decrease the resistivity of the affected polysilicon. Highly resistive polysilicon requires less area than silicided polysilicon to achieve a high impedance resistor. In a conventional process, in which a single spacer etch is performed across the entire wafer, it is necessary to introduce a silicide block mask step to prevent all of the polysilicon from being silicided. The present invention beneficially enables a designer to leverage the spacer etch masks that are in place during the two spacer etch processes to define un-silicided portions of the polysilicon. Thus, one embodiment of the invention contemplates a process tradeoff in which the addition of an extra spacer etch process is offset by the reduction of a mask step. Generally speaking, this is a highly desirable tradeoff since photolithography processing is typically a more expensive process to perform due to the cost of photolithography equipment and the load demands that are placed on them.

Returning to the discussion of FIG. 5, a second spacer etch process indicated by reference numeral 135 is performed on the portions of the spacer film left exposed by second spacer etch mask 130 to produce second spacers 136 on sidewalls of gate 108 of first transistor 106. Second spacer etch process 135 preferably has a different isotropy than the first spacer etch process. More specifically, in an embodiment wherein the first spacer etch process is relatively anisotropic, second spacer etch process 135 is relatively isotropic. The relatively isotropic etch process may include a non-magnetically enhanced, low-pressure spacer etch process. In this embodiment, second spacer etch process 135 may be characterized by an anisotropy of approximately 0.7 or less, which will be recognized by those in the field as characteristic of a relatively isotropic etch process that produces a relatively narrow spacer. Thus, a PECVD silicon nitride embodiment of spacer film 118 having a thickness of 600 angstroms may produce second spacers 136 having a thickness of approximately 420 angstroms. In one embodiment, second spacer etch process 135 may use an RF power of approximately 100 W, a pressure of 50 millitorr, an HBr flow rate of 10 sccm, and an $SF_6$ flow rate of 80 sccm. Thus, relative to first spacer etch process 125, second spacer etch process may use lower RF power, lower pressure, lower (or no) magnetic field, and a different etch gas ($SF_6$ v. $CF_4$) to achieve greater isotropy.

Figure 6:
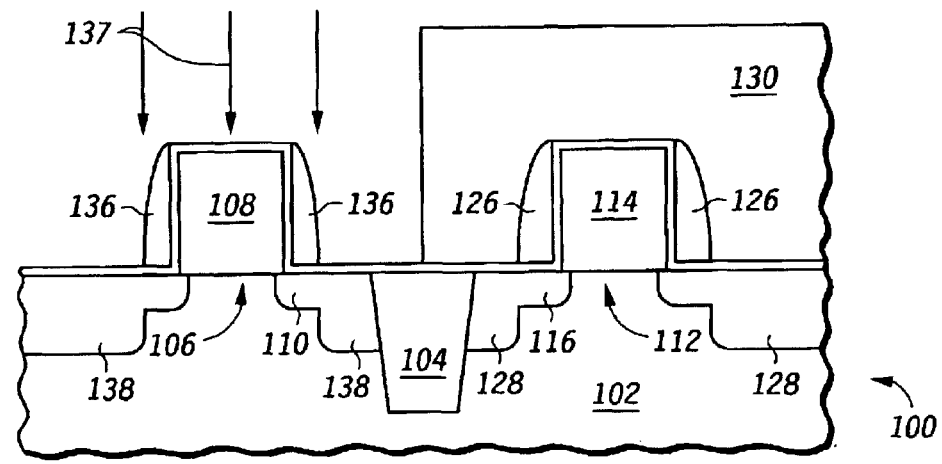
FIG. 6 illustrates processing subsequent to FIG. 5 in which in which a second source/drain implant is introduced into unmasked portions of the wafer.

Turning now to FIG. 6, a source/drain regions 138 are introduced into portions of substrate 102 exposed by second spacer etch mask 130 laterally disposed on either side of second spacers 136. Source/drain regions 138 are preferably introduced via an ion implantation process indicated by reference numeral 137 using spacer structures 136 and gate 108 as an implant blocking mask on those portions of wafer 100 exposed by second spacer etch mask 130. Thus, as was the case with respect to first spacer etch mask 120 and source/drain regions 128, second spacer etch mask 130 and source/drain regions 138 are defined using a common mask. Source/drain regions 138 likely contain a high concentration of the conventional implant impurities such as boron, arsenic, phosphorous, and antimony depending on the conductivity type of transistor 106.

Figure 7:
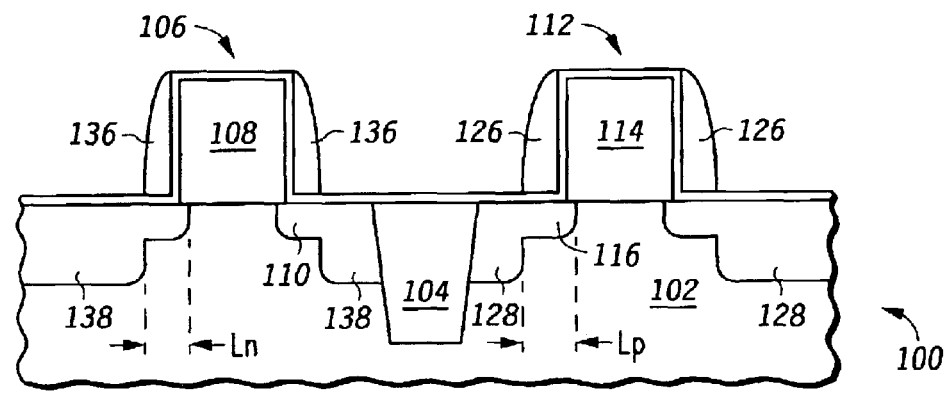
FIG. 7 illustrates processing subsequent to FIG. 5 in which the second spacer etch mask is removed and emphasizing the extension length differences of the transistors.

Turning now to FIG. 7, second spacer etch mask 138 has been removed leaving behind a substantially completed first transistor 106 and second transistor 112. Due to the different dimensions of their respective spacers, first transistor 106 and second transistor 112 have different transistor extension lengths where, for purposes of this disclosure, transistor extension length is roughly approximated by the lateral displacement between the channel-side edge of the transistors source/drain region and the edge of its extension implant region. More specifically, the depicted embodiment, in which first transistor 106 is an n-channel transistor and second transistor 112 is a p-channel transistor, illustrates the transistor extension length (Ln) of first transistor 106 as less than the transistor extension length (Lp) of second transistor 112 because the width of spacers 126 is less than the width of spacers 136. The depicted embodiment beneficially enables the fabrication of sub-micron CMOS devices in which the relatively long extension length of the p-channel transistors guards against an unacceptably high sub-threshold leakage current while the relatively short extension length of the n-channel transistors improves performance characteristics including the n-channel saturated drain current.

Thus it will apparent to those skilled in the art having the benefit of this disclosure that there has been provided, in accordance with the invention, a process for fabricating a an integrated circuit that achieves the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications as fall within the scope of the appended clams and equivalents thereof.

What is claimed is:

1. A semiconductor fabrication process, comprising:
   forming a first gate over a first portion of a semiconductor substrate and a second gate over a second portion of the substrate;
   depositing a spacer film over the substrate and the first and second gates; and forming first spacers on sidewalls of the first gate by etching the spacer film with a first spacer etch and forming second spacers on sidewalls of the second gate by etching the spacer film with a second spacer etch wherein the first spacer etch is characterized as being more anisotropic than the second spacer etch, wherein the difference in isotropy between the first and second etches causes the first and second spacers to have different widths.

2. The method of claim 1, further comprising:

forming first source/drain regions in the substrate laterally disposed on either side of the first spacers; and forming second source/drain regions in the substrate laterally disposed on either side of the second spacers.

3. The method of claim 1, wherein forming the first and second spacers comprises:

masking the first portion of the substrate with a first spacer mask;

etching portions of the spacer film exposed by the first spacer mask using the first spacer etch;

masking the second portion of the substrate with a second spacer mask;

etching portions of the spacer fin exposed by the second spacer mask using the second spacer etch.

4. The method of claim 3, wherein the first spacer etch process is further characterized as having an anisotropy of at least 0.9 and the second spacer etch process is further characterized as having an anisotropy of at most 0.7.

5. The method of claim 1, wherein the first spacer etch process comprises a magnetically enhanced plasma etch process having a first RF energy and the second spacer etch process comprises a non-magnetically enhanced plasma etch process having a second RF energy, where the first RF energy is greater than the second RF energy.

6. The method of claim 3, wherein the first spacer etch mask is used as a mask for a first source/drain implant and the second spacer etch mask is used as a mask for a second source/drain implant.

7. The method of claim 6, wherein the first spacer etch mask exposes portions of the substrate containing p-channel transistors and the second spacer etch mask exposes portions of the substrate containing n-channel transistors.

8. The method of claim 3, wherein the first spacer etch mask and the second spacer etch mask are substantially mirror images of each other.

9. The method of claim 3, wherein the first and second spacer etch masks both mask at least some common portions of the spacer film.

10. The method of claim 9, wherein the common portions masked by the first and second spacer etch mask comprise regions of the spacer film overlying high resistivity regions of a polysilicon film wherein the first and second spacer etch mas prevent silicidation of the high resistivity regions of the polysilicon film having higher resistivity than remaining portions of the gate layer film.

11. The method of claim 1, wherein depositing the spacer film comprises depositing silicon nitride.

12. The method of claim 1, wherein the first gate is characterized as a p-channel transistor gate and the second gate is characterized as an n-channel transistor gate.

13. The method of claim 12, further comprising:

forming p-channel and n-channel extension implant regions displaced on either side of the corresponding gate prior to forming the first and second spacers; and forming p-channel and n-channel source/drain implant regions displaced on either side of the corresponding gate after forming the first and second spacers respectively;

wherein the first spacers are wider than the second space and wherein an extension length of p-channel transistors is longer than an extension length of nchanmel transistors.

14. An integrated circuit fabricated according to the method of claim 1.

15. A semiconductor fabrication method, comprising forming a gate of a first transistor over a first portion of a semiconductor substrate and a gate of a second transistor over a second portion of a semiconductor substrate;

depositing a spacer film over the substrate and the transistor gates; and etching a first portion of the spacer film with a first etch process and etching a second portion of the space film with a second etch process, wherein the anisotropy of the first etch process is greater than the anisotropy of the second etch process and wherein a width of a spacer resulting from the first etch process is greater than a width or a spacer resulting form the second etch process.

16. The method of claim 15, further comprising:

forming first and second extension implant regions displaced on either side of the first and second transistor gates prior to forming the relatively wide and narrow spacers; and forming first and second source/drain implant regions displaced on either side of the first and second transistor gates, respectively after forming the wide and narrow spacers wherein an extension length of the first transistor is longer than an extension length of the second transistor.

17. The method of claim 15, wherein the first transistor is further characterized as a pi channel transistor and the second transistor is further characterized as an n-channel transistor.

18. The method of claim 15, further comprising, masking the second portion of the spacer film during the etching of the first portion of the film and masking the first portion of the spacer film during the etching of the second portion.

19. The method of claim 18, further comprising, implanting a first source/drain impurity following the first etch before removing the second portion mask and implanting a second source/drain impurity following the second etch before removing the first portion mask wherein the fist and second masks both serve as a spacer etch mask and an implant mask.

* * * * *

UNITED STATES PATENT AND TRADEMARK OFFICE
CERTIFICATE OF CORRECTION

PATENT NO. : 6,864135 B2  
APPLICATION NO. : 10/285374  
DATED : October 31, 2002  
INVENTOR(S) : Paul A. Grudowski It is certified that error appears in the above-identified patent and that said Letters Patent is hereby corrected as shown below:

In Column 7, Line 53, Claim No. 10:
    Change "mas prevent silicidation" to --masks prevent silicidation--

In Column 8, Line 11, Claim No. 13:
    Change "length of nchanmel" to --length of n-channel--

In Column 8, Line 28, Claim No. 15:
    Change "width or a spacer" to --width of a spacer--

In Column 8, Line 42, Claim No. 17:
    Change "as a pi channel transistor" to --as a p-channel transistor--

Signed and Sealed this

Twentieth Day of May, 2008

JON W. DUDAS  
*Director of the United States Patent and Trademark Office*

UNITED STATES PATENT AND TRADEMARK OFFICE
CERTIFICATE OF CORRECTION

PATENT NO. : 6,864135 B2
APPLICATION NO. : 10/285374
DATED : March 8, 2005
INVENTOR(S) : Paul A. Grudowski et al.

It is certified that error appears in the above-identified patent and that said Letters Patent is hereby corrected as shown below:

In Column 7, Line 53, Claim No. 10:
    Change "mas prevent silicidation" to --masks prevent silicidation--

In Column 8, Line 11, Claim No. 13:
    Change "length of nchanmel" to --length of n-channel--

In Column 8, Line 28, Claim No. 15:
    Change "width or a spacer" to --width of a spacer--

In Column 8, Line 42, Claim No. 17:
    Change "as a pi channel transistor" to --as a p-channel transistor--

This certificate supersedes the Certificate of Correction issued May 20, 2008.

Signed and Sealed this

Seventeenth Day of June, 2008

JON W. DUDAS
*Director of the United States Patent and Trademark Office*